United States Patent
Yeh et al.

(10) Patent No.: US 7,364,926 B2
(45) Date of Patent: Apr. 29, 2008

(54) METHOD FOR MANUFACTURING GALLIUM NITRIDE LIGHT EMITTING DIODE DEVICES

(75) Inventors: Li-Shei Yeh, Shulin (TW); Bor-Jen Wu, Taipei (TW); Chien-An Chen, Hsin-Chuang (TW); Hsiao-Ping Chiu, Toufen Town (TW)

(73) Assignee: Uni Light Technology Inc., Tao-Yuan (TW)

( * ) Notice: Subject to any disclaimer, the term of this patent is extended or adjusted under 35 U.S.C. 154(b) by 111 days.

(21) Appl. No.: 11/490,050

(22) Filed: Jul. 21, 2006

(65) Prior Publication Data

US 2007/0292978 A1 Dec. 20, 2007

(30) Foreign Application Priority Data

Jun. 16, 2006 (TW) .............................. 95121630 A

(51) Int. Cl.
*H01L 21/00* (2006.01)
*H01L 21/30* (2006.01)
*H01L 21/46* (2006.01)
*H01L 21/20* (2006.01)
*H01L 21/36* (2006.01)

(52) U.S. Cl. .................... 438/22; 438/46; 438/458; 438/479

(58) Field of Classification Search ................ 438/22, 438/458, 479, 455, 462, 68, 460, 113, 459, 438/33
See application file for complete search history.

(56) References Cited

U.S. PATENT DOCUMENTS

| 6,563,141 B1 * | 5/2003 | Dawson et al. ............... 257/98 |
| 6,884,646 B1 | 4/2005 | Wu et al. |
| 7,071,015 B2 * | 7/2006 | Shakuda ...................... 438/46 |
| 7,279,718 B2 * | 10/2007 | Krames et al. ............... 257/98 |

* cited by examiner

*Primary Examiner*—Chuong Anh Luu
(74) *Attorney, Agent, or Firm*—Rosenberg, Klein & Lee

(57) ABSTRACT

A method for manufacturing GaN LED devices is disclosed herein. First, a LED epitaxial layer is formed on a provisional substrate. Part of the LED epitaxial layer is removed to form a plurality of LED epitaxial areas. Then, a first transparent conductive layer, a metal reflective layer, and a first metal bonding layer are sequentially formed on the plurality of LED epitaxial areas and then part of the first transparent conductive layer, the metal reflective layer, and the first metal bonding layer are removed. Next, a permanent substrate is provided. At least a metal layer and a second metal bonding layer are formed on the permanent substrate. Then, part of at least the metal layer and the second metal bonding layer are removed. Next, the provisional substrate is bonded to the permanent substrate by aligned wafer bonding method. Then, the provisional substrate is removed to expose a surface of the LED epitaxial layer and then an n-type electrode is formed on the surface. Next, the permanent substrate is cut to form a plurality of LED devices.

20 Claims, 8 Drawing Sheets

METHOD FOR MANUFACTURING GALLIUM NITRIDE LIGHT EMITTING DIODE DEVICES

BACKGROUND OF THE INVENTION

1. Field of the Invention

The present invention generally relates to a method for manufacturing LED devices, and more particularly to a method for manufacturing GaN LED devices by using aligned wafer bonding technology.

2. Description of the Prior Art

Since GaN possesses a wide band gap (Eg=3.4 eV in room temperature) and its spectrum is near the wavelength of blue light, GaN is suitable for manufacturing short wavelength LED devices, and it further becomes one of the most popular materials for developing photoelectric elements. Nowadays, GaN can grow steadily on a sapphire substrate. Moreover, GaN can be utilized in making short wavelength light-emitting devices. However, because the sapphire has low thermal conductivity, it will worsen the reliability of the device.

FIGS. 1A to FIG. 1D are cross-sectional diagrams of a traditional method for manufacturing LED devices. The details are disclosed in U.S. Pat. No. 6884646 entitled 'METHOD FOR FORMING AN LED DEVICE WITH A METALLIC SUBSTRATE.' First, a provisional substrate 20 is provided. Then, a LED epitaxial layer 21, a first electrode layer 25, and a conduction enhancing layer 26 are sequentially formed on the provisional substrate 20. Next, a metallic permanent substrate 27 is formed on the conduction enhancing layer 26. Next, the provisional substrate 20 is removed to expose a surface of the LED epitaxial layer 21. Then, a plurality of second electrodes 28 are formed on the surface of the LED epitaxial layer 21. Finally, the metallic permanent substrate 27, the conduction enhancing layer 26, the first electrode layer 25 and the LED epitaxial layer 21 are cut to form a plurality of LED devices. The provisional substrate 20 can be sapphire. Because sapphire has low thermal conductivity, the provisional substrate 20, i.e. sapphire, is removed after a metallic permanent substrate 27 is formed on the GaN LED epitaxial layer 21. Accordingly, the LED devices have good thermal conductivity, and good electrostatic discharge effect, and therefore are capable of operating on high current condition. However, by electroplating technology the metallic permanent substrate 27 is formed. Accordingly, the difference of coefficient of thermal expansion between the metallic permanent substrate 27 and the semiconductor will cause the metallic permanent substrate 27 bending or peeling.

In view of the abovementioned drawbacks of the traditional method for manufacturing LED devices, there is a need for a new method for manufacturing LED devices, whose permanent substrates not only have good thermal conductivity, i.e. good heat dissipation ability and good electrostatic discharge effect, but also are free from bending or peeling.

SUMMARY OF THE INVENTION

One object of the present invention is to provide a method for manufacturing GaN LED devices by aligned wafer bonding technology to bond a provisional substrate and a permanent substrate. The provisional substrate has a plurality of LED epitaxial areas thereon and each of LED epitaxial areas has a first metal pattern area thereon, and the permanent substrate has a plurality of second metal pattern areas thereon.

Another object of the present invention is to provide a method for manufacturing GaN LED devices, wherein a plurality of LED epitaxial areas are formed on the provisional substrate, and the provisional substrate is bonded to the permanent substrate which has a good heat dissipation effect and is free from peeling, and then the provisional substrate is removed.

Further another object of the present invention is to provide a method for manufacturing GaN LED devices, wherein a plurality of LED epitaxial areas formed on the provisional substrate, and each of the first metal pattern areas formed on each of LED epitaxial areas, and a plurality of second metal pattern areas formed on the permanent substrate are pattern-defined before the permanent substrate is cut, so that during the cutting process the plurality of LED devices are free from damage.

According to the above-mentioned objects, the present invention provides a method for manufacturing GaN LED devices. First, a LED epitaxial layer is formed on a provisional substrate. Part of the LED epitaxial layer is removed to form a plurality of LED epitaxial areas. Then, a transparent conductive layer, a metal reflective layer, and a first metal bonding layer are sequentially formed on the plurality of LED epitaxial areas and then part of the transparent conductive layer, the metal reflector, and the first metal bonding layer are removed. Next, a permanent substrate is provided. At least a metal layer and a second metal bonding layer are formed on the permanent substrate. Then, part of at least the metal layer and the second metal bonding layer are removed. Next, the provisional substrate and the permanent substrate are bonded together by aligned wafer bonding method. Then, the provisional substrate is removed to expose a surface of the LED epitaxial layer and then an n-type electrode is formed on the surface. Next, the permanent substrate is cut to form a plurality of LED devices.

DETAILED DESCRIPTION OF THE INVENTION

Some embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Note that, the components of the different elements are not shown to scale. Some dimensions of the related components are exaggerated to provide a more clear description and comprehension of the present invention.

Figure 1A:
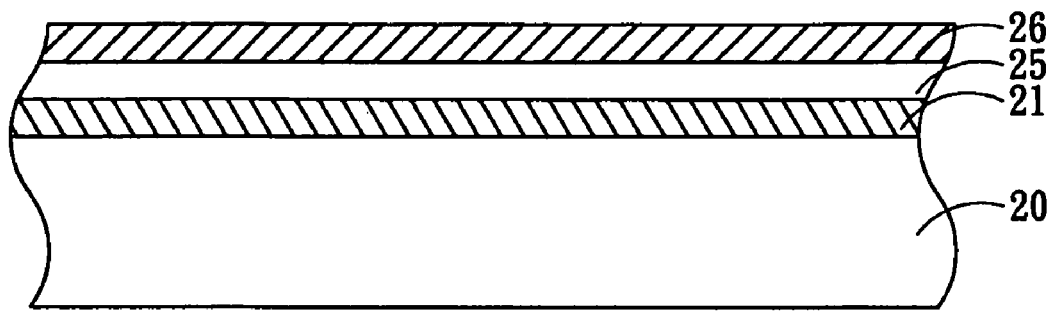
FIGS. 1A to FIG. 1D are cross-sectional diagrams of a traditional method for manufacturing LED devices.
Figure 1B:
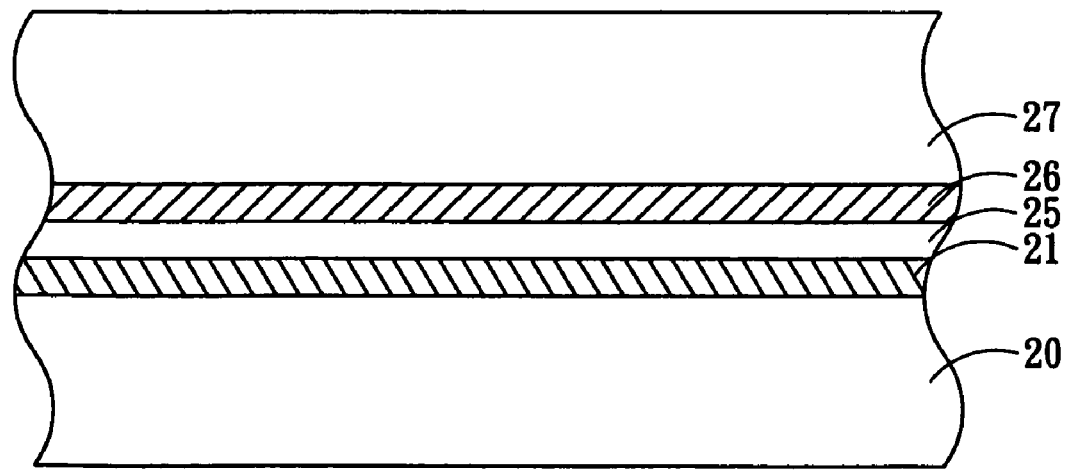
Figure 1C:
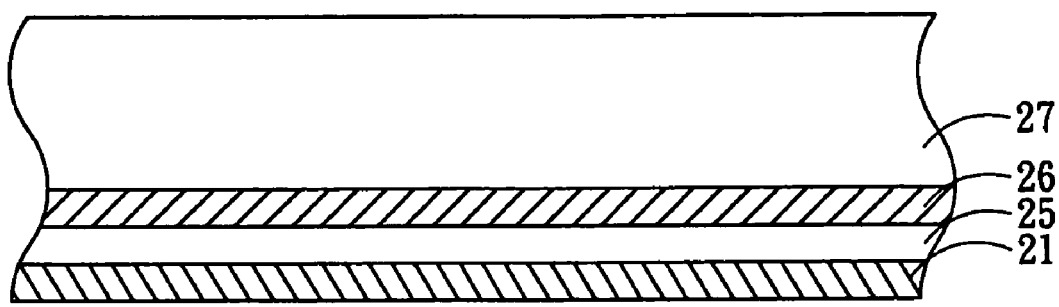
Figure 1D:
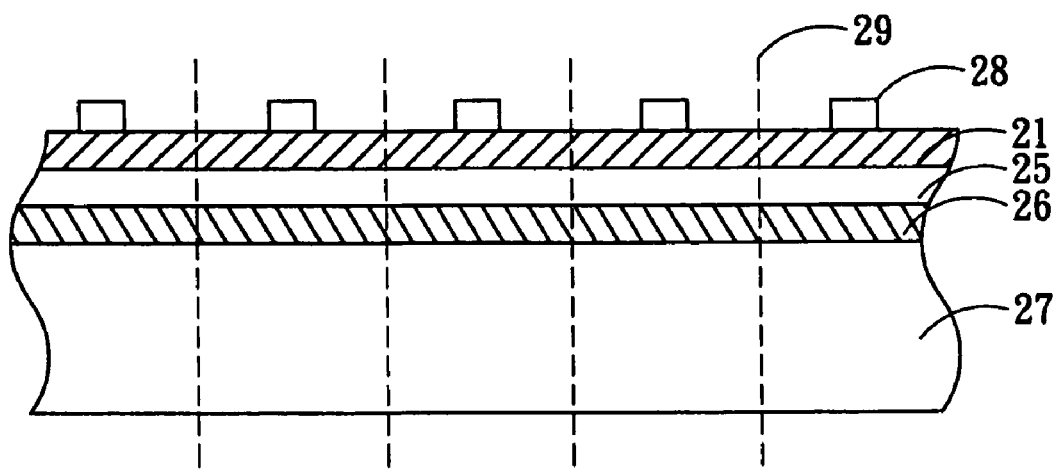
Figure 2A:
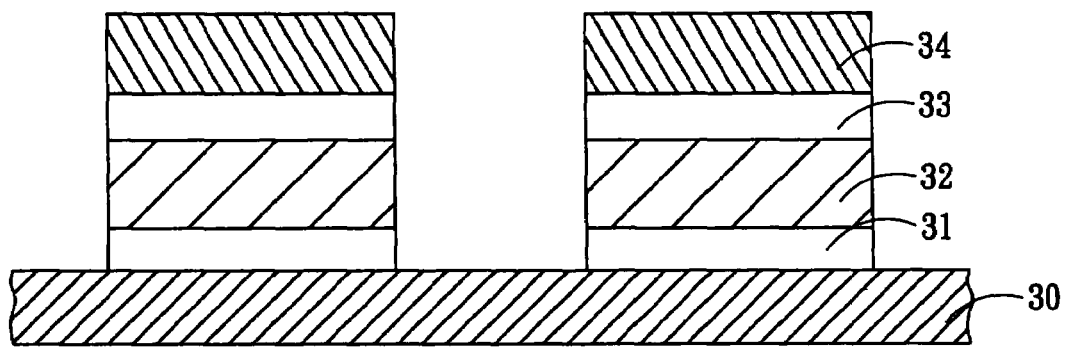
FIGS. 2A to FIG. 2E are cross-sectional diagrams of a method for manufacturing GaN LED devices according to one embodiment of the present invention.

FIGS. 2A to FIG. 2E are cross-sectional diagrams of a method for manufacturing GaN LED devices according to one embodiment of the present invention. FIG. 3A and FIG. 3B respectively show layouts of a provisional substrate and a permanent substrate according to one embodiment of the present invention. First, as shown in FIG. 2A, a provisional substrate 30 is provided. The provisional substrate 30 in this embodiment can be made of sapphire. A GaN buffer layer 31 and a GaN LED epitaxial layer are sequentially formed on the provisional substrate 30. The GaN LED epitaxial layer sequentially includes an n-type GaN layer 32, a multi-quantum well active layer (MQW active layer) 33 and a p-type GaN layer 34. Then, by photolithography and dry-etching or wet-etching processes, part of the GaN buffer layer 31 and the GaN LED epitaxial layer is etched from p-type GaN layer 34 to the provisional substrate 30, or to the n-type GaN layer 32 (not shown in the figure) to form a plurality of LED epitaxial areas.

Figure 2B:
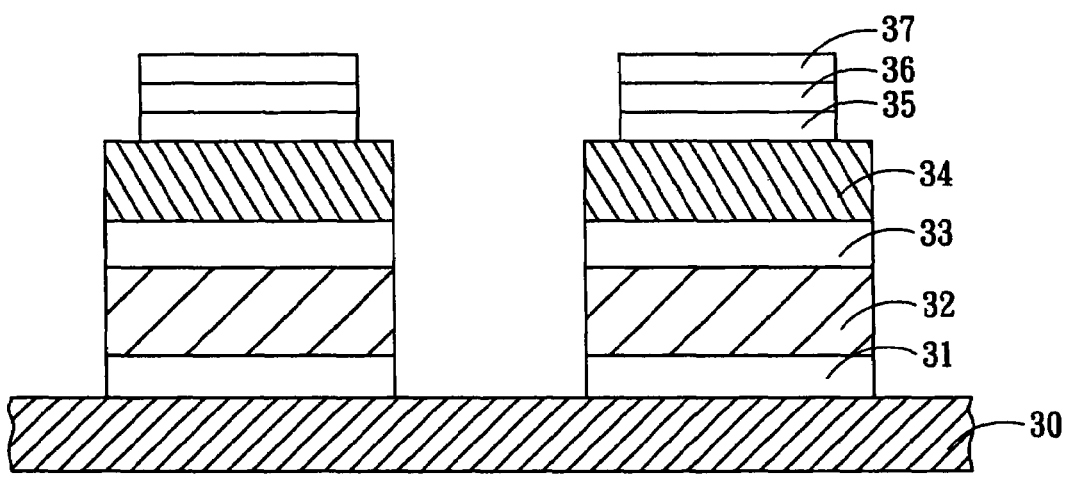
Figure 3A:
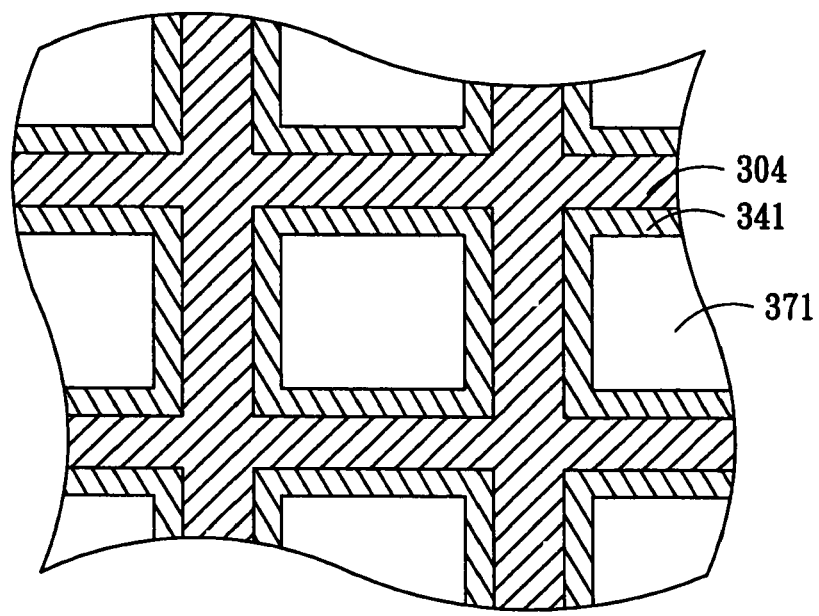
FIG. 3A and FIG. 3B respectively show layouts of a provisional substrate and a permanent substrate according to one embodiment of the present invention.
Figure 3B:
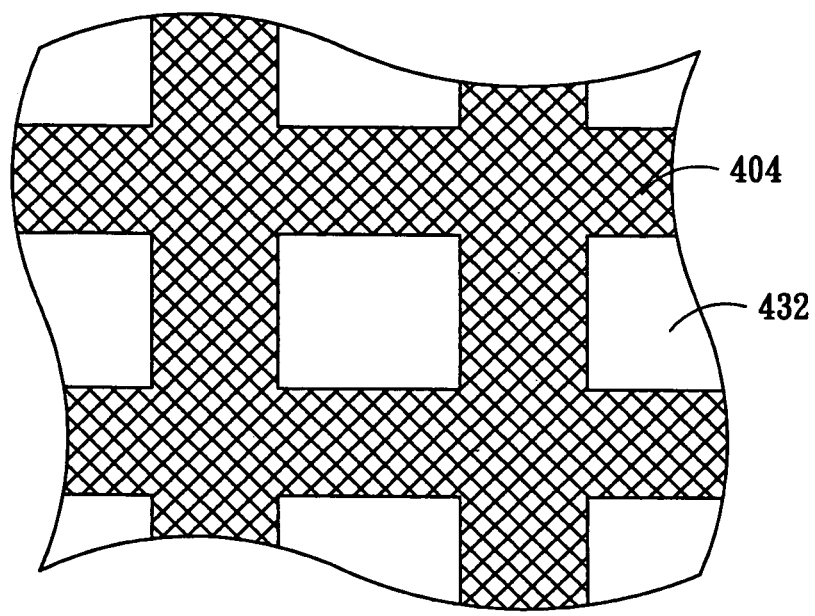

Then, as shown in FIG. 2B, by evaporation deposition, sputtering deposition, or electroplating technology, a first transparent conductive layer 35, a metal reflective layer 36 and a first metal bonding layer 37 are sequentially formed on p-type GaN layer 34. In this embodiment, the material of the first transparent conductive layer 35 can be NiO/Au, Indium Tin Oxide (ITO), ZnO or Aluminum Zinc Oxide (AlZnO). The first transparent conductive layer 35 is used to form Ohmic Contact with the semiconductor layer. In the embodiment, the metal reflective layer 36 can be made of Ni, Pd, Cr, Pt, Al or Ag. The metal reflective layer 36 is used to reflect the light emitted from the LED epitaxial layer, and as a diffusion barrier layer. In the embodiment, the first metal bonding layer 37 as a medium to be bonded to the permanent substrate 40 can be made of Au or Au Alloy. Then, by photolithography and dry-etching or wet-etching processes, part of the first transparent conductive layer 35, and the metal reflective layer 36 and the first metal bonding layer 37 are removed to form a plurality of first metal pattern areas 371. Each of the LED epitaxial areas 341 have a first metal pattern area 371 thereon. Accordingly, the layout of the provisional substrate 30 includes a plurality of LED epitaxial areas 341 and empty area 304. The first metal pattern area 371 is a little smaller than the LED epitaxial area 341, as shown in FIG. 3A. If the first metal pattern area 371 is greater than or equal to the LED epitaxial area 341, when the photolithography process misalign, the metal will short with the LED epitaxial layer so that the current cannot flow from p-type GaN layer 34 through MQW active layer 33 to n-type GaN layer 32, and light cannot be emitted by the LED device.

Figure 2C:
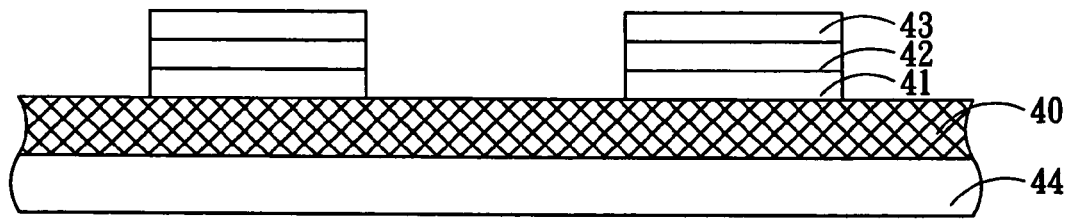

Next, as shown in FIG. 2C, a permanent substrate 40 is provided. The permanent substrate 40 is a nonmetal substrate, but has better heat conductivity than sapphire. The permanent substrate 40 can be a nonmetal conductive substrate, such as Si wafer. By evaporation deposition, sputtering deposition or electroplating technology, a first metal layer 41, a second metal layer 42 and a second metal bonding layer 43 are sequentially formed on the permanent substrate 40. In this embodiment, the first metal layer 41 used to form Ohmic Contact with the Si wafer can be made of Al. The second metal layer 42, i.e. the diffusion barrier layer, can be made of Ni, Pd, Cr, or Pt. The second metal bonding layer 43 used to be connected to the first metal bonding layer 37 of the provisional substrate 30 can be made of Au or Au Alloy. Then, by photography and dry-etching or wet-etching processed, part of the first metal layer 41, the second metal layer 42 and the second metal bonding layer 43 are removed to form a plurality of second metal pattern areas 432, and the removed area is cutting street 404, as shown in FIG. 3B. Each of second metal pattern areas 432 has the same size with the corresponding first metal pattern layer 371. Then, a package contact layer 44 is formed below the permanent substrate 40. In this embodiment, the package contact layer 44 can be made of Au or Au Alloy, and is used to contact with the outside, e.g. to be connected to a Printed Circuit Board (PCB).

Moreover, if the permanent substrate 40 is a metallic substrate, the difference of coefficient of thermal expansion between the metallic substrate and GaN semiconductor substrate or Si wafer will cause stress between them so that the metallic substrate will be bending or peeling. In this embodiment, a plurality of first metal pattern areas 371 on the provisional substrate 30 and a plurality of second metal pattern areas 432 on the permanent substrate 40 will keep the permanent substrate 40 from bending or peeling. Furthermore, the first metal bonding layer 37 of each of first metal pattern areas 371 and the second bonding layer 43 of each of second metal pattern areas 432 can be divided into several areas (not shown in the figure) to benefit bonding.

Figure 2D:
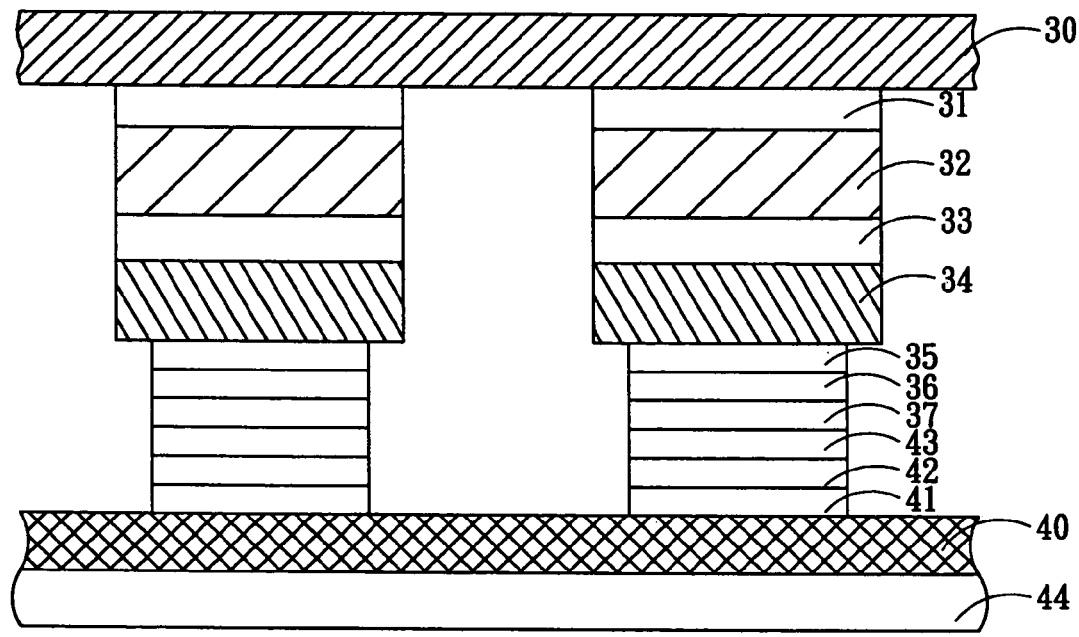

Then, as shown in FIG. 2D, the aligned wafer bonding technology is performed on the provisional substrate 30 and the permanent substrate 40. That is, the provisional substrate 30 and the permanent substrate 40 are aligned, and then the provisional substrate 30 is bonded to the permanent substrate 40. In this embodiment, the wafer bonding technology can be Thermal Bonding, Thermal Compression Bonding, or Thermal Ultrasonic Bonding.

Figure 2E:
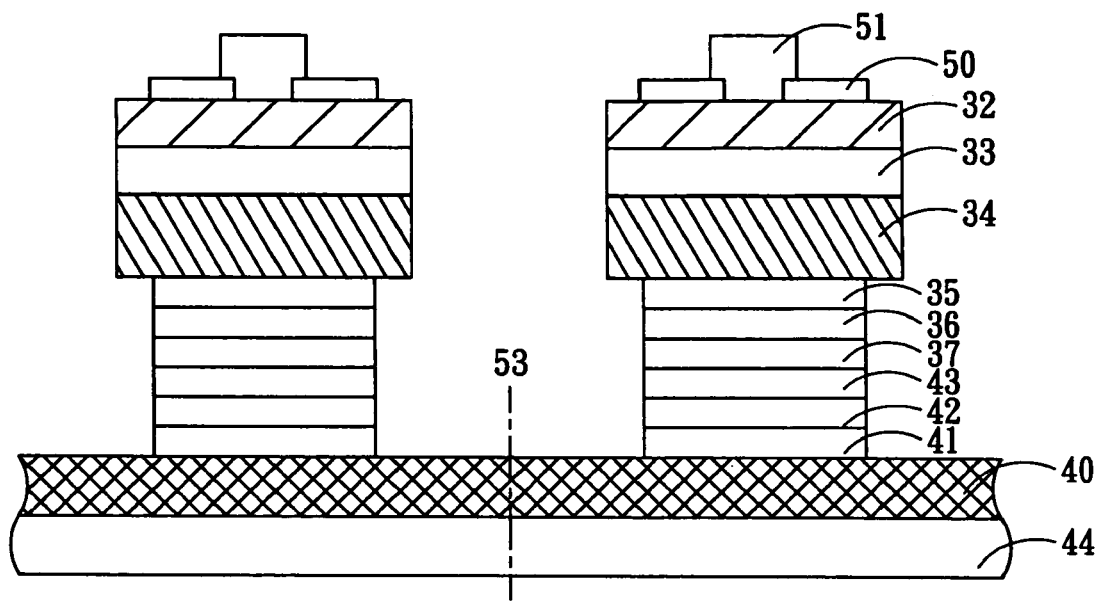

Then, as shown in FIG. 2E, by polishing or laser lift-off technology, the provisional substrate 30 is separated from the LED epitaxial layer to expose the n-type GaN layer 32. Next, a second transparent layer 50 is formed on the n-type GaN layer 32. In this embodiment, the second transparent conductive layer 50 can be made of NiO/Au, ITO, ZnO, or AlZnO. By photolithography and dry-etching or wet-etching technology, part of the second transparent conductive layer 50 is removed to form a plurality of second transparent conductive layer areas. The area of each of the remained second transparent conductive layer 50 is also smaller than the LED epitaxial area 341 to avoid short circuit. At the same time, each of second transparent conductive layer areas has an opening thereon. Then, an n-type electrode 51 is formed in the opening to be connected to the n-type GaN layer 32. Next, the permanent substrate 40 is cut to form a plurality of inverted vertical GaN LED devices. In this embodiment, the cutting technology can be dicing saw, scriber cutting, or laser cutting.

Figure 4A:
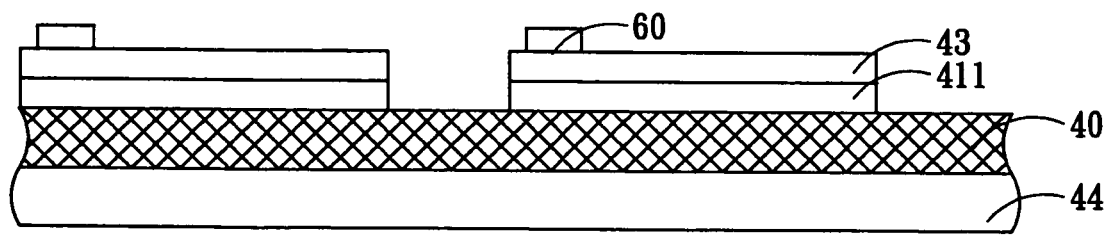
FIGS. 4A to FIG. 4C are cross-sectional diagrams of a method for manufacturing GaN LED devices according to another embodiment of the present invention.
Figure 4B:
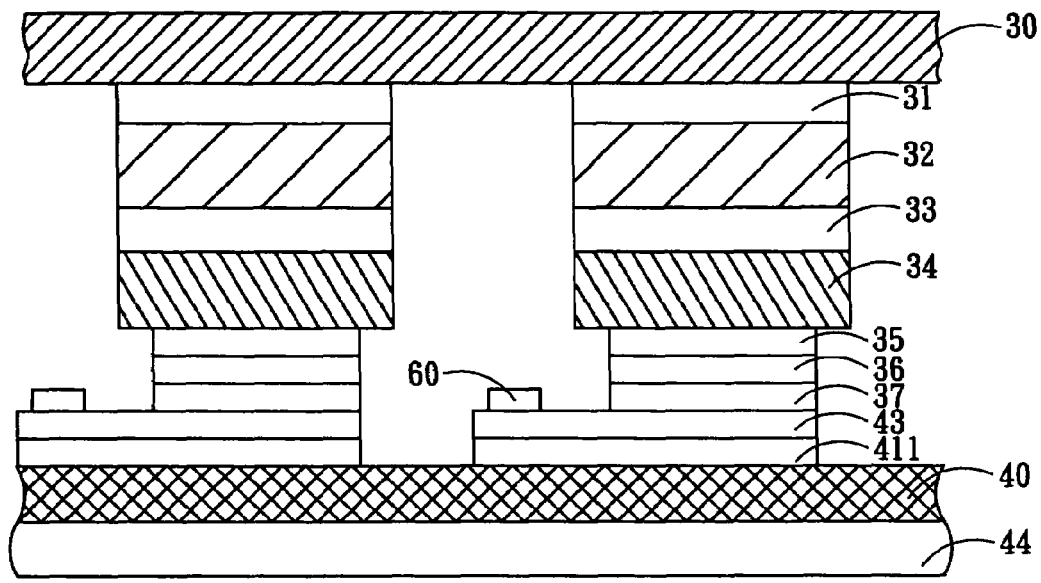
Figure 4C:
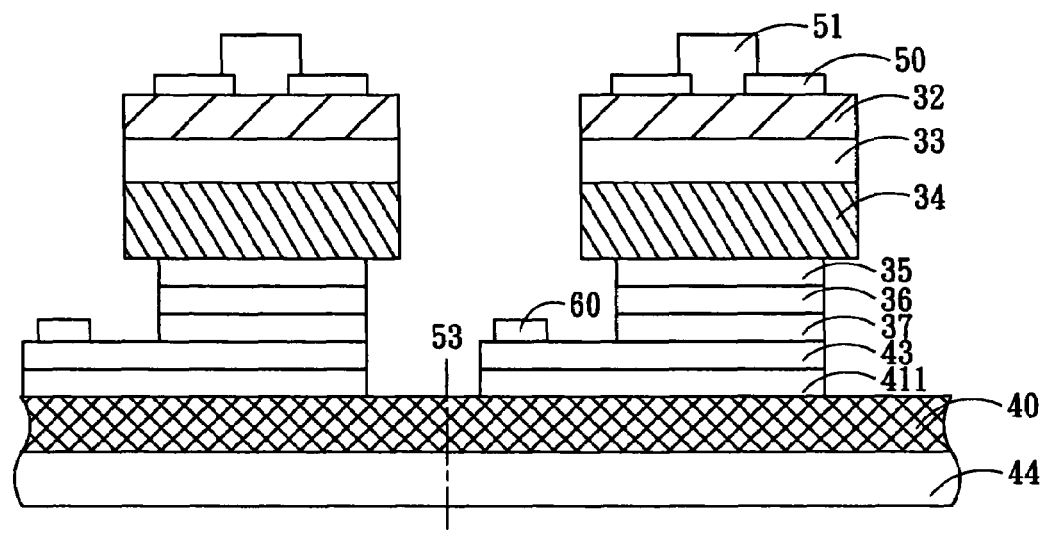
Figure 5A:
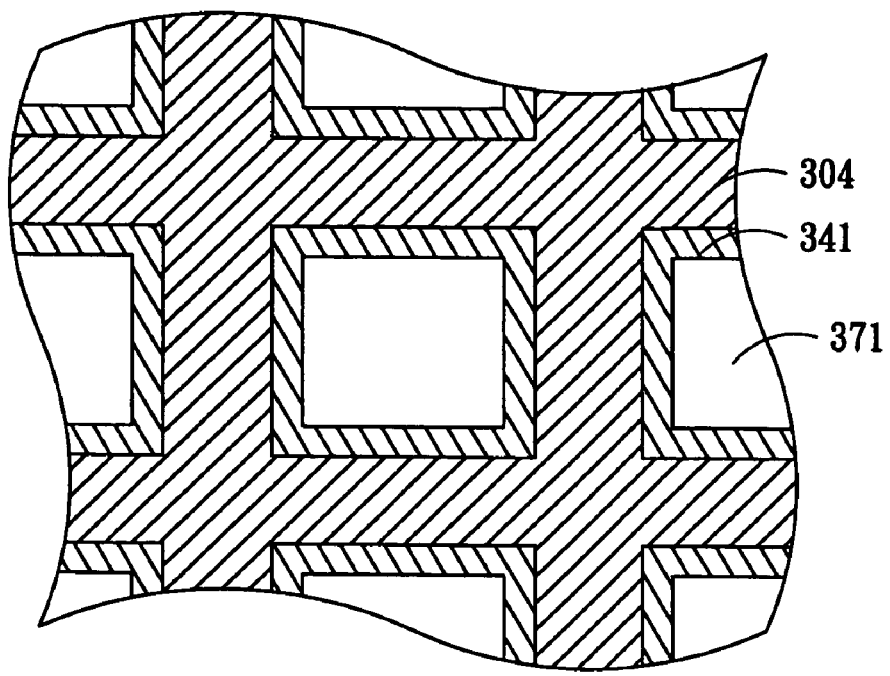
FIG. 5A and FIG. 5B respectively show layouts of a provisional substrate and a permanent substrate according to another embodiment of the present invention.
Figure 5B:
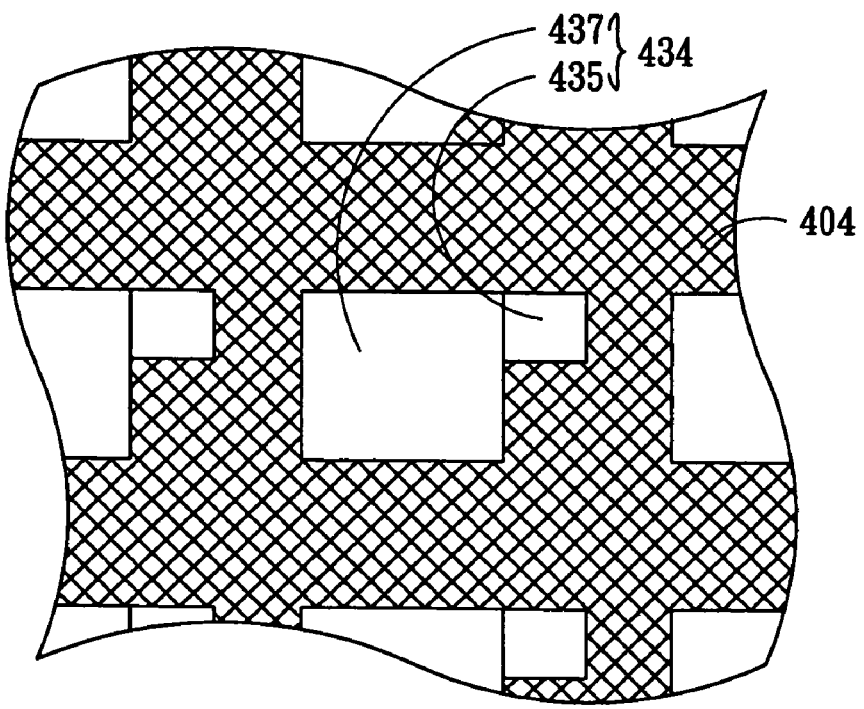

FIGS. 4A to FIG. 4C are cross-sectional diagrams of a method for manufacturing GaN LED devices according to another embodiment of the present invention. FIG. 5A and FIG. 5B respectively show layouts of a provisional substrate and a permanent substrate according to another embodiment of the present invention. In this embodiment, only the differences from the previous embodiment will be described. That is, the processes on the permanent substrate 40 will be described. The processes on the provisional substrate 30 in this embodiment are the same with those in the previous embodiment, also as shown in FIG. 2A and FIG. 2B. In this embodiment, the permanent substrate 40 also has better heat conductivity than sapphire, such as AlN substrate or Zener diode wafer. As shown in FIG. 4A, by evaporation deposition, sputtering deposition, or electroplating technology, a metal adhesion layer 411 and a second metal bonding layer 43 are sequentially formed on the permanent substrate 40. In this embodiment, the metal adhesion layer 411 can be made of Ti. The second metal bonding layer 43 can adhere on the metal adhesion layer 411. Next, by photolithography and dry-etching or wet-etching technology, part of the metal adhesion layer 411 and the second metal bonding layer 43 are removed to form a plurality of second metal pattern areas 434. A second metal pattern area includes a metal area 437 and a p-type electrode area 435. The metal-free area is cutting street 404, as shown in FIG. 5B. In this embodiment, a p-type electrode 60 is formed on a p-type electrode area 435, so that the LED emits light because current can flow into the LED epitaxial layer from the p-type electrode 60. Accordingly, the corresponding layout of the provisional substrate 30 includes LED epitaxial areas 341 and empty area 304, as shown in FIG. 5A. However, layouts of the provisional substrate 30 and the permanent substrate 40 of this embodiment are not limited to these scopes. Then, a p-type electrode 60 is formed on a p-type electrode area 435. Next, the provisional substrate 30 is bonded to the permanent substrate 40. The bonding process and the following processes are the same with those in the previous embodiment, as shown in FIG. 4B and FIG. 4C.

In the present invention, i.e. the method for manufacturing GaN LED devices, a GaN epitaxial layer is formed on a sapphire provisional substrate, which is an insulating material and has low thermal conductivity. Thus, the GaN epitaxial layer is bonded to a permanent substrate with a better thermal conductivity. Then, the sapphire provisional substrate is removed to form a plurality of inverted GaN LED devices. Accordingly, the permanent substrate which is a nonmetal substrate has better thermal conductivity and is free from bending or peeling owing to the little difference of coefficient of thermal expansion between the nonmetal substrate and the semiconductor layer. Moreover, a plurality of LED epitaxial areas are formed on the provisional substrate. Each of the LED epitaxial areas has a first metal pattern area thereon. Furthermore, a plurality of second metal pattern areas are formed on the permanent substrate. Because the provisional substrate and the permanent substrate have patterns thereon before bonding, it is necessary by using aligned wafer bonding technology to bond the provisional substrate and the permanent substrate. Accordingly, after the provisional substrate is removed, and all of the patterns have already been formed, the cutting of the permanent substrate can be performed without damaging the LED structure. Moreover, the first metal pattern area and the second transparent conductive layer area have a smaller area than the LED epitaxial area to avoid short circuit owing to the misalignment of the photolithography process. In one embodiment of the present invention, a plurality of inverted vertical LED devices are formed. In another embodiment of the present invention, each of the second metal pattern area of the permanent substrate has a p-type electrode area to have a p-type electrode thereon so that the LED device emits light when current flows from the p-type electrode to the LED epitaxial layer.

Although specific embodiments have been illustrated and described, it will be appreciated by those skilled in the art that various modifications may be made without departing from the scope of the present invention, which is intended to be limited solely by the appended claims.

What is claimed is:

1. A method for manufacturing GaN LED devices, comprising the steps of:
    (a) providing a provisional substrate;
    (b) forming a LED epitaxial layer on said provisional substrate;
    (c) removing part of said LED epitaxial layer to form a plurality of LED epitaxial areas;
    (d) forming sequentially a first transparent conductive layer, a metal reflective layer, and a first metal bonding layer on said plurality of LED epitaxial areas;
    (e) removing part of said first transparent conductive layer, said metal reflective layer, and said first metal bonding layer to form a first metal pattern area on each of said LED epitaxial areas;
    (f) providing a permanent substrate;
    (g) forming at least a metal layer and a second metal bonding layer on said permanent substrate;
    (h) removing part of at least said metal layer and said second metal bonding layer to form a plurality of second metal pattern areas;
    (i) bonding said first metal bonding layer of said provisional substrate and said second metal bonding layer of said permanent substrate;
    (j) removing said provisional substrate to expose a surface of said LED epitaxial layer;
    (k) forming an n-type electrode on said surface; and
    (l) cutting said permanent substrate to form a plurality of LED devices.

2. The method for manufacturing GaN LED devices according to claim 1, wherein said LED epitaxial layer sequentially include an n-type GaN layer, a multi-quantum well active layer (MQW active layer), and a p-type GaN layer.

3. The method for manufacturing GaN LED devices according to claim 1, further comprising forming a GaN buffer layer between said provisional substrate and said LED epitaxial layer.

4. The method for manufacturing GaN LED devices according to claim 1, wherein a material of said first metal bonding layer and said second metal bonding layer is Au or Au Alloy.

5. The method for manufacturing GaN LED devices according to claim 1, wherein a method for forming said first metal bonding layer and said second metal bonding layer is evaporation deposition, sputtering deposition or electroplating.

6. The method for manufacturing GaN LED devices according to claim 1, wherein a material of said metal reflective layer is Ni, Pd, Cr, Pt, Al, or Ag.

7. The method for manufacturing GaN LED devices according to claim 1, wherein said bonding technology in said step (i) is aligned wafer bonding technology.

8. The method for manufacturing GaN LED devices according to claim 7, wherein said wafer bonding technology is Thermal Bonding, Thermal Compression Bonding, or Thermal Ultrasonic Bonding.

9. The method for manufacturing GaN LED devices according to claim 1, wherein a method in said step of removing said provisional substrate is completed by etching, polishing, layer lift-off or combination thereof.

10. The method for manufacturing GaN LED devices according to claim 1, further comprising forming a package contact layer below said permanent substrate used to connect to outside during package.

11. The method for manufacturing GaN LED devices according to claim 1, further comprising after said step (j) forming a second transparent conductive layer having an opening on said surface so that said n-type electrode is formed in said opening to is connected to said LED epitaxial layer.

12. The method for manufacturing GaN LED devices according to claim 11, wherein said first metal pattern area and said second transparent conductive layer area are of the same size but smaller than said LED epitaxial area.

13. The method for manufacturing GaN LED devices according to claim 11, wherein a material of said first transparent conductive layer and said transparent conductive layer is NiO/Au, ITO, ZnO, or AlZnO.

14. The method for manufacturing GaN LED devices according to claim 1, wherein said step of cutting said permanent substrate is by dicing saw, scriber cutting, or laser cutting.

15. The method for manufacturing GaN LED devices according to claim 1, wherein said permanent substrate is Si wafer.

16. The method for manufacturing GaN LED devices according to claim 15, wherein said step of forming at least said metal layer on said permanent substrate is to form sequentially an Ohmic Contact layer and a diffusion barrier layer on said permanent substrate.

17. The method for manufacturing GaN LED devices according to claim 16, wherein said diffusion barrier is made of Ni, Pd, Cr, or Pt.

18. The method for manufacturing GaN LED devices according to claim 1, wherein said permanent substrate is AlN wafer or Zener diode wafer.

19. The method for manufacturing GaN LED devices according to claim 18, wherein in said step (g) at least said metal layer is a metal adhesion layer to connect said permanent substrate and said second metal bonding layer.

20. The method for manufacturing GaN LED devices according to claim 18, wherein in said step (h) each of said second metal pattern areas comprises a p-type electrode area having a p-type electrode thereon so that LED device emits light when current flows to said LED epitaxial layer from said p-type electrode.

* * * * *